US010978170B2

(12) United States Patent
Lee et al.

(10) Patent No.: US 10,978,170 B2
(45) Date of Patent: Apr. 13, 2021

(54) METHOD AND SYSTEM FOR MONITORING INFORMATION OF A MEMORY MODULE IN REAL TIME

(71) Applicant: SAMSUNG ELECTRONICS CO., LTD., Suwon-si (KR)

(72) Inventors: Young-ho Lee, Seoul (KR); Sung-joo Park, Anyang-si (KR); Young Yun, Yongin-si (KR); Yong-jin Kim, Incheon (KR); Jae-jun Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 16/124,379

(22) Filed: Sep. 7, 2018

(65) Prior Publication Data

US 2019/0237152 A1 Aug. 1, 2019

(30) Foreign Application Priority Data

Jan. 26, 2018 (KR) .......................... 10-2018-0010119

(51) Int. Cl.
| | | |
|---|---|---|
| *G11C 29/00* | (2006.01) | |
| *G11C 29/38* | (2006.01) | |
| *G11C 29/36* | (2006.01) | |
| *G11C 11/409* | (2006.01) | |
| *G11C 7/10* | (2006.01) | |
| *G01K 7/01* | (2006.01) | |
| *H05K 1/11* | (2006.01) | |
| *H05K 1/18* | (2006.01) | |
| *G11C 5/04* | (2006.01) | |

(52) U.S. Cl.
CPC ............ *G11C 29/38* (2013.01); *G11C 7/1063* (2013.01); *G11C 11/409* (2013.01); *G11C 29/00* (2013.01); *G11C 29/36* (2013.01); *G01K 7/01* (2013.01); *G11C 5/04* (2013.01); *H05K 1/117* (2013.01); *H05K 1/181* (2013.01); *H05K 2201/10151* (2013.01); *H05K 2201/10159* (2013.01); *H05K 2201/10522* (2013.01)

(58) Field of Classification Search
CPC ....... G11C 29/38; G11C 29/00; G11C 7/1063; G11C 29/36; G11C 11/409; G11C 5/04; G11C 29/26; G11C 2029/5602; G11C 29/56008; G11C 29/48; G11C 29/46; G01K 7/01; H05K 2201/10151; H05K 2201/10159; H05K 2201/10522; H05K 1/117; H05K 1/181; G06F 11/3037; G06F 11/3058
USPC .................................................. 714/718, 763
See application file for complete search history.

(56) References Cited

U.S. PATENT DOCUMENTS

| | | |
|---|---|---|
| 6,809,914 B2 | 10/2004 | Edmonds et al. |
| 7,451,053 B2 | 11/2008 | Jeong |
| 7,677,796 B2 | 3/2010 | Janzen et al. |

(Continued)

*Primary Examiner* — Albert Decady
*Assistant Examiner* — Osman M Alshack
(74) *Attorney, Agent, or Firm* — F. Chau & Associates, LLC

(57) ABSTRACT

A memory device including: a loopback circuit for performing a loopback operation, wherein the loopback operation includes receiving, via a loopback channel, test signals provided from a test device and feeding back the test signals to the test device via the loopback channel; and an information management circuit for outputting information of the memory device to the loopback channel.

12 Claims, 11 Drawing Sheets

(56) References Cited

U.S. PATENT DOCUMENTS

| | | | |
|---|---|---|---|
| 7,775,710 B2 | 8/2010 | Mukherjee | |
| 8,122,265 B2 | 2/2012 | Radhakrishnan et al. | |
| 8,272,781 B2 | 9/2012 | Nale | |
| 9,436,548 B2* | 9/2016 | Goodman | G06F 11/1076 |
| 9,767,920 B2* | 9/2017 | Kim | G11C 29/42 |
| 10,002,044 B2* | 6/2018 | Hu | G06F 11/1048 |
| 10,061,642 B2* | 8/2018 | Baek | G06F 11/10 |
| 10,388,396 B2* | 8/2019 | Best | G11C 11/401 |
| 2006/0239095 A1 | 10/2006 | Shi et al. | |
| 2006/0253756 A1* | 11/2006 | Bucksch | G11C 29/56 |
| | | | 714/728 |
| 2007/0211548 A1 | 9/2007 | Jain et al. | |
| 2008/0307276 A1* | 12/2008 | Bodrozic | G01R 31/31716 |
| | | | 714/719 |
| 2009/0296504 A1* | 12/2009 | Ishikawa | G11C 29/1201 |
| | | | 365/201 |
| 2013/0198587 A1* | 8/2013 | Kim | G06F 11/1048 |
| | | | 714/763 |
| 2015/0003172 A1* | 1/2015 | Kim | G11C 11/40626 |
| | | | 365/189.05 |
| 2018/0136866 A1* | 5/2018 | Eugenio | G06F 11/22 |
| 2018/0294044 A1* | 10/2018 | Fu | G11C 29/48 |

* cited by examiner

METHOD AND SYSTEM FOR MONITORING INFORMATION OF A MEMORY MODULE IN REAL TIME

CROSS-REFERENCE TO RELATED APPLICATION

This application claims priority under 35 U.S.C. § 119 to Korean Patent Application No. 10-2018-0010119, filed on Jan. 26, 2018, in the Korean Intellectual Property Office, the disclosure of which is incorporated by reference herein in its entirety.

TECHNICAL FIELD

The inventive concept relates to a memory system, and more particularly, to monitoring information of a memory module in real time.

DISCUSSION OF RELATED ART

A memory module is a printed circuit board on which semiconductor memory devices are mounted. There exists a variety of types of memory modules, such as registered dual in-line memory modules (RDIMMs), load reduced DIMMs (LRDIMMs), unbuffered or unregistered DIMMs (UDIMMs), or small outline DIMMs (SODIMMs). In use, memory modules are inserted into a socket of a printed circuit board or a mother board.

As integration levels and operation speeds of memory modules increase, the memory modules themselves generate a large amount of heat. For example, as an air gap between memory modules decreases, the memory modules generate more heat. This may increase a temperature inside a system in which the memory modules are employed. Since heat generated from memory modules may cause the memory modules to poorly operate or cause a system to slow down, there is a need to monitor and control temperatures of the memory modules in real time.

SUMMARY

According to an exemplary embodiment of the inventive concept, there is provided a memory device including: a loopback circuit for performing a loopback operation, wherein the loopback operation includes receiving, via a loopback channel, test signals provided from a test device and feeding back the test signals to the test device via the loopback channel; and an information management circuit for outputting information of the memory device to the loopback channel.

According to an exemplary embodiment of the inventive concept, there is provided a memory module including: a printed circuit board; connectors disposed on the printed circuit board; a plurality of memory devices mounted to the printed circuit board; and a buffer chip mounted to the printed circuit board, wherein the buffer chip provides, to the plurality of memory devices, signals that were provided to the connectors of the printed circuit board, wherein each of the plurality of memory devices includes: a loopback circuit for performing a loopback operation, wherein the loopback operation includes receiving, via the buffer chip, test signals provided to a loopback channel and feeding back the test signals to the loopback channel via the buffer chip, wherein the loopback channel is connected to some of the connectors of the printed circuit board; and an information management circuit for outputting information of the memory device to the loopback channel via the buffer chip.

According to an exemplary embodiment of the inventive concept, there is provided a method of operating a memory module, the method including: in a test operation for a validity test of memory devices mounted to the memory module, performing a loopback operation, in which the memory devices feed back test signals to test equipment via a loopback channel, wherein the test signals are received from the test equipment; in a data processing operation for the memory module, performing a write operation or a read operation of the memory devices; and outputting information of a memory device selected from among the memory devices, by using the loopback channel.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
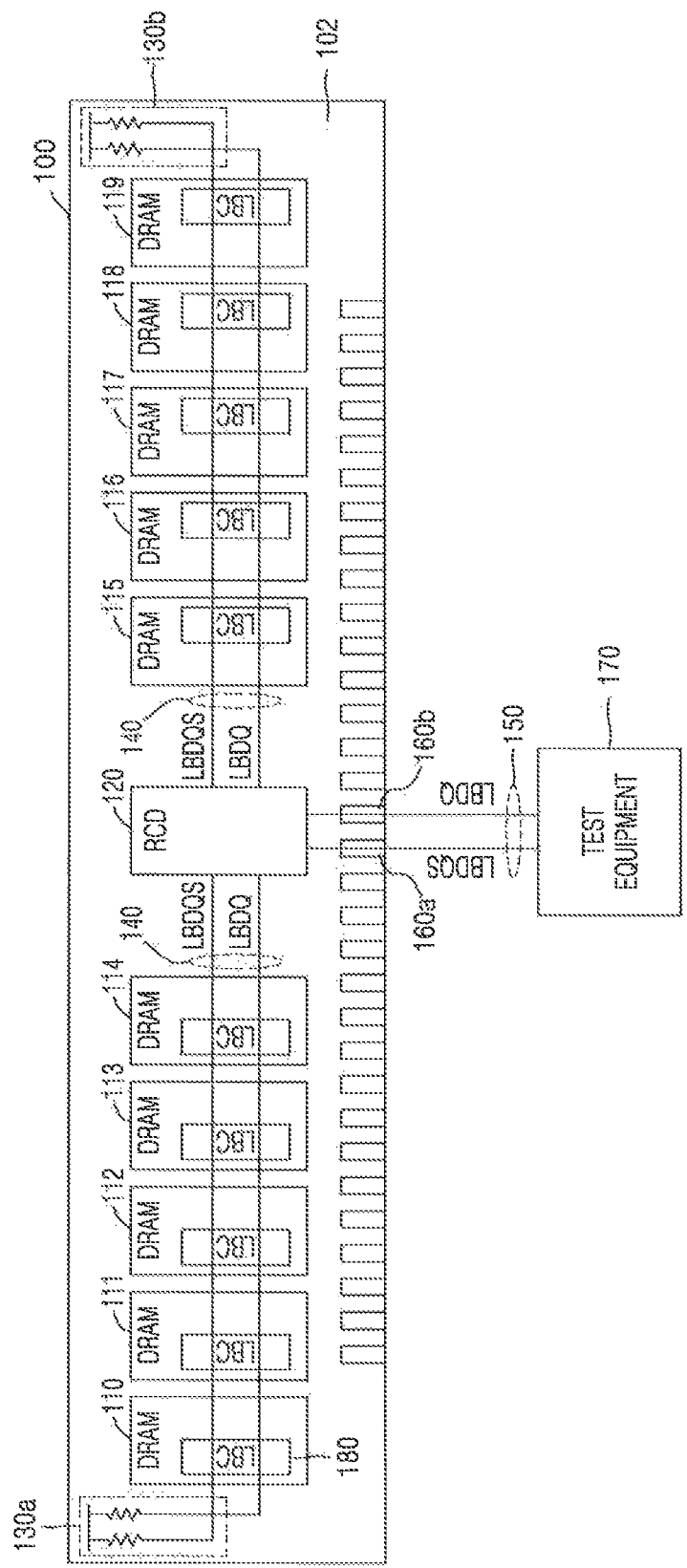
FIG. 1 is a schematic diagram illustrating a loopback channel used with an exemplary embodiment of the inventive concept.

FIG. 1 is a schematic diagram illustrating a loopback channel used with an exemplary embodiment of the inventive concept.

Referring to FIG. 1, in a memory module 100, memory devices 110, 111, 112, 113, 114, 115, 116, 117, 118 and 119, a buffer chip 120, and termination units 130*a* and 130*b* are mounted to a printed circuit board 102. Connectors (or pins) 160*a* and 160*b* are formed at regular intervals along an edge of one long side of the printed circuit board 102. When the memory module 100 is inserted into a socket of another device, the connectors 160a and 160b are brought into contact with and electrically connected to pins of a slot formed in the socket. In this case, a command signal, an address signal, a clock signal, a data signal, and the like may be transferred from the other device to the memory module 100.

The buffer chip 120 may receive a command signal, an address signal, a clock signal, and a data signal from outside of the memory module 100, and may buffer and provide the received command signal, address signal, clock signal, and data signal to the memory devices 110 to 119. Test equipment 170 or a memory controller 210 (FIG. 2) may provide the signals to the memory module 100. Since the buffer chip 120 buffers the command signal, the address signal, the clock signal, and the data signal, the test equipment 170 or the memory controller 210 may interface with the memory module 100 by driving only a load of the buffer chip 120.

According to an exemplary embodiment of the inventive concept, to ensure data signal integrity, the data signal may be provided to the memory devices 110 to 119 via a data buffer respectively connected to the memory devices 110 to 119 or via a direct wiring line, rather than via the buffer chip 120.

Each of the memory devices 110 to 119 may be clock synchronization type dynamic random access memory (DRAM) such as synchronous DRAM (SDRAM). For example, each of the memory devices 110 to 119 may be a memory device such as a double data rate (DDR) SDRAM, a low power double data rate (LPDDR) SDRAM, a graphics double data rate (GDDR) SDRAM, a rambus DRAM (RDRAM), or the like.

The memory devices 110 to 119 may write data to a DRAM memory cell or read data from the DRAM memory cell in response to write/read commands received from the test equipment 170 or the memory controller 210 via the buffer chip 120. The DRAM memory cell is arranged at an intersection between a plurality of bit lines and a plurality of word lines, includes one cell transistor and one cell capacitor, and has a property of finite data retention. As process scaling of DRAM continues, capacitance of a cell capacitor decreases. Thus, since a bit error rate (BER) increases, the reliability of data stored in a DRAM memory cell may be deteriorated. To increase the reliability of data, each of the memory devices 110 to 119 is analyzed regarding the BER, and is subjected to a DRAM validity test through the BER analysis.

The memory devices 110 to 119 may perform a loopback operation, which includes feeding back, to the test equipment 170, signals or data received from the test equipment 170. The loopback operation is an operation in which the test equipment 170 immediately reads back data sent to each of the memory devices 110 to 119 by the test equipment 170. For example, the test equipment 170 may immediately read back the data sent to each of the memory devices 110 to 119 without issuing write/read commands. Since the loopback operation causes the data sent to each of the memory devices 110 to 119 by the test equipment 170 to be sent to a loopback path before being sent to a core of each of the memory devices 110 to 119, the write/read commands are not issued. The loopback path may be a path including a loopback circuit (LBC) 180 for performing the loopback operation in each of the memory devices 110 to 119.

The test equipment 170 may provide a first loopback signal LBDQS and a second loopback signal LBDQ to the buffer chip 120 via a loopback channel 150. The first loopback signal LBDQS may be a single-ended loopback strobe, and the second loopback signal LBDQ may be a single-ended loopback datum.

The buffer chip 120 may receive the first and second loopback signals LBDQS and LBDQ and may transmit the received first and second loopback signals LBDQS and LBDQ to each of the memory devices 110 to 119 via a loopback bus 140. The loopback bus 140, via which the first and second loopback signals LBDQS and LBDQ are transmitted, may be connected to the termination units 130a and 130b.

As transmission speeds of the first and second loopback signals LBDQS and LBDQ increase, there is a need to minimize delay time required for signal transfer. For example, swing ranges of the first and second loopback signals LBDQS and LBDQ can be reduced to minimize the delay time. However, as the swing ranges of the first and second loopback signals LBDQS and LBDQ decrease, an influence of external noise on the memory devices 110 to 119 increases. Therefore, signal reflection due to impedance mismatching becomes critical at an interface stage. If impedance mismatching occurs in the process of signal transmission, signal integrity can be compromised. To improve signal integrity by minimizing the signal reflection of the first and second loopback signals LBDQS and LBDQ, the termination units 130a and 130b may be connected to the loopback bus 140 via which the first and second loopback signals LBDQS and LBDQ are transmitted.

The test equipment 170 may transmit the first and second loopback signals LBDQS and LBDQ to the buffer chip 120 of the memory module 100 via the loopback channel 150. In addition, the buffer chip 120 may transmit the first and second loopback signals LBDQS and LBDQ to each of the memory devices 110 to 119 via the loopback bus 140. Each of the memory devices 110 to 119 may include the loopback circuit 180 for performing the loopback operation, which includes feeding back the received first and second loopback signals LBDQS and LBDQ to the test equipment 170. To perform the loopback operation, the loopback circuit 180 may include multiplexers for selecting a data signal and a distributed clock signal.

The test equipment 170 may select one of the memory devices 110 to 119, and may request the loopback operation to be performed by the selected memory device. The test equipment 170 may immediately read back the first and second loopback signals LBDQS and LBDQ sent to the selected memory device, and may perform a BER calculation for the selected memory device based on the read-back first and second loopback signals LBDQS and LBDQ. The test equipment 170 may perform the BER analysis based on results of the BER calculation obtained from all of the memory devices 110 to 119, and thus, may complete a DRAM validity test.

The loopback bus 140 and the loopback channel 150, via which the first and second loopback signals LBDQS and LBDQ are transmitted and received, are used only in a test operation of the memory module 100 for the DRAM validity test. For example, the loopback bus 140 and the loopback channel 150 are not used in a data processing operation for the memory module 100, for example, when performing write/read operations of the memory devices 110 to 119. While the memory devices 110 to 119 of the memory module 100 perform the write/read operations, if information of the memory module 100 is provided in real time by using the loopback bus 140 and the loopback channel 150, which are not used in the write/read operations, this may help to improve the performance of a system in which the memory module 100 is mounted. The information of the memory module 100 may include, for example, a temperature and/or power status of the memory module 100, and operation modes, temperatures and/or power status of the memory devices 110 to 119, and the like.

Figure 2:
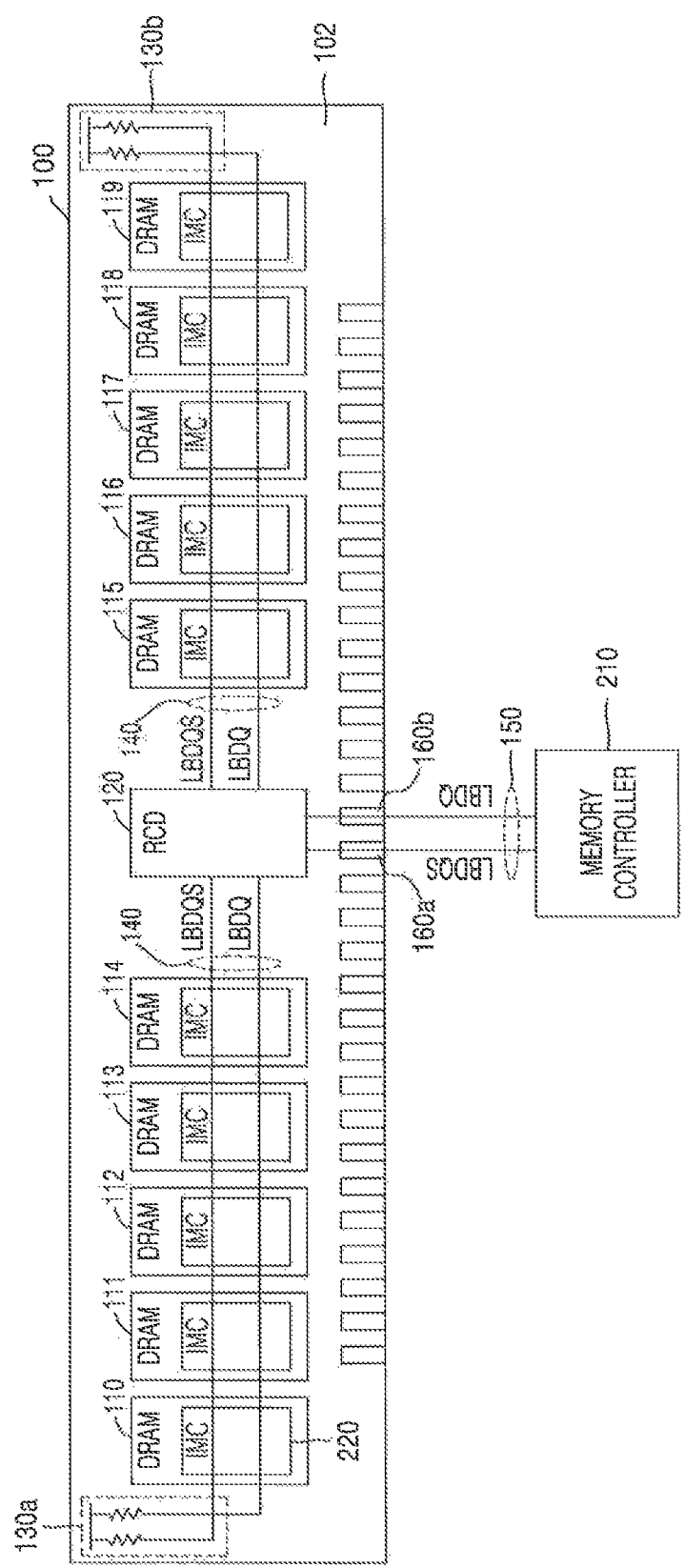
FIG. 2 is a block diagram illustrating a memory module including a memory device, according to an exemplary embodiment of the inventive concept.

FIG. 2 is a block diagram illustrating a memory module including a memory device, according to an exemplary embodiment of the inventive concept.

Referring to FIG. 2, in the memory module 100, the memory devices 110 to 119, the buffer chip 120, and the termination units 130a and 130b are mounted to the printed circuit board 102. The memory module 100 of FIG. 2 is different from the memory module 100 of FIG. 1 in that the memory module 100 of FIG. 2 is connected to the memory controller 210, and that each of the memory devices 110 to 119 includes an information management circuit (IMC) 220. The other components of the memory module 100 of FIG. 2 are substantially identical to those of the memory module 100 of FIG. 1. Hereinafter, a difference between the memory module 100 of FIG. 2 and the memory module 100 of FIG. 1 will be mainly described.

The memory module 100 may be accessed by the memory controller 210. The memory controller 210 may be a central processing unit (CPU) or a graphics processing unit (GPU), and may include a calculation device (CPU core) and cache memory. The memory module 100 and the memory controller 210 may constitute a memory system included in an electronic device.

The electronic device may be a computer, a portable computer, an ultra mobile personal computer (UMPC), a workstation, a data server, a netbook, a personal digital assistant (PDA), a web tablet, a wireless phone, a mobile phone, a smart phone, an electronic book, a portable multimedia player (PMP), a digital camera, a digital audio recorder/player, a digital camera/video recorder/player, a portable game machine, a navigation system, a black box, a 3-dimensional television, a device collecting and transmitting information in a wireless environment, one of various electronic devices constituting a home network, one of various electronic devices constituting a computer network, one of various electronic devices constituting a telematics network, a radio frequency identifier (RFID), or one of various electronic devices constituting a computing system. According to an exemplary embodiment of the inventive concept, the electronic device may be or include one of the various devices set forth above, or combinations thereof. In addition, the electronic device is not limited to the devices set forth above, and may include a newly developed electronic device.

The memory controller 210 may control data processing operations (for example, write or read operations) for the memory module 100. The memory controller 210 may provide a command signal, an address signal, a clock signal, and a data signal to the buffer chip 120, and may control write and read operations for the memory devices 110 to 119 via the buffer chip 120.

The memory controller 210 receives the information about the memory module 100 via the loopback channel 150 while controlling the data processing operations for the memory module 100. In a test operation of the DRAM validity test for the memory module 100, the loopback channel 150 may include signal lines via which the first and second loopback signals LBDQS and LBDQ are transmitted and received. Since the loopback channel 150 is not used in the data processing operations for the memory module 100, the loopback channel 150 may be used for providing the information about the memory module 100 during the data processing operations.

Figure 3:
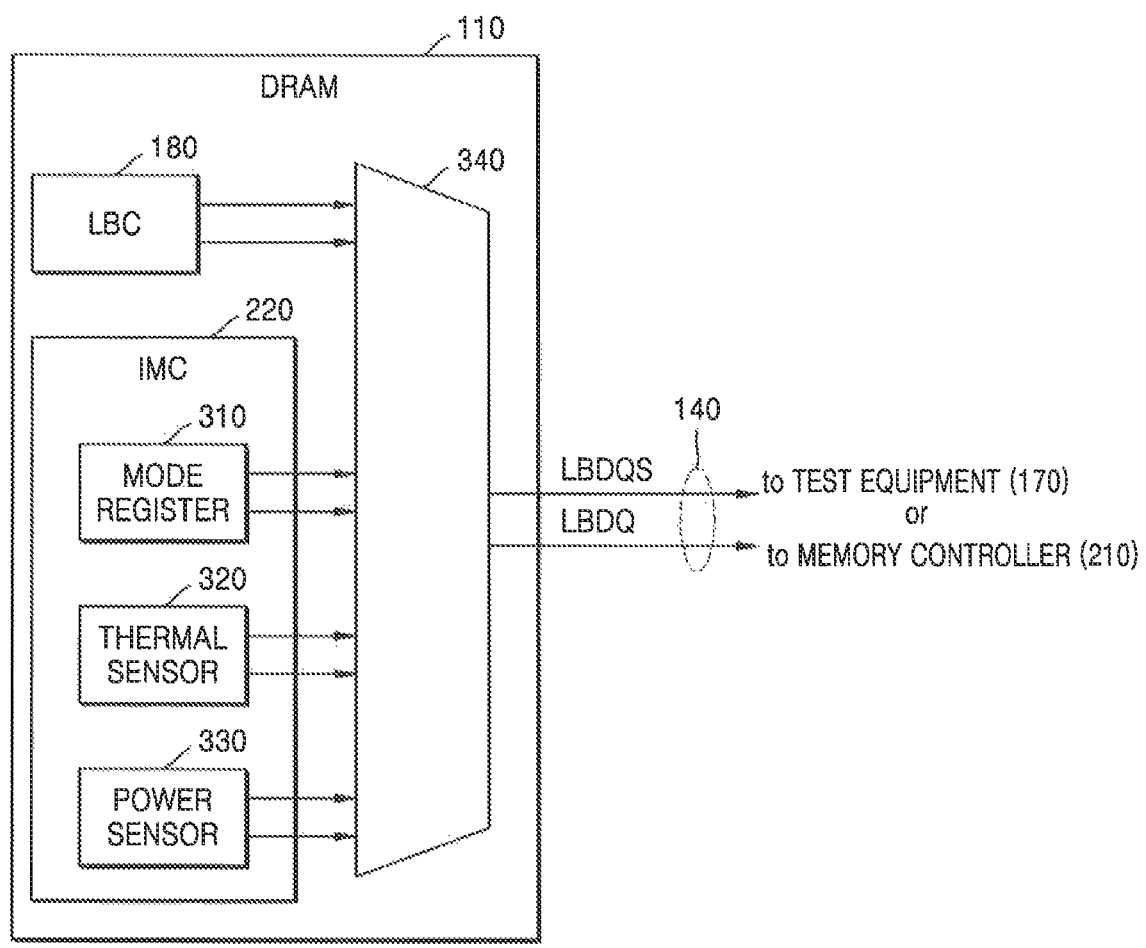
FIG. 3 is a diagram illustrating a memory device according to an exemplary embodiment of the inventive concept.

FIG. 3 is a diagram illustrating a memory device according to an exemplary embodiment of the inventive concept. A memory device 110 of FIG. 3 is representatively illustrated as one of the memory devices 110 to 119 of the memory module 100. It will be understood that descriptions of the memory device 110 may be identically applied to the other memory devices 111 to 119.

Referring to FIG. 3, the memory device 110 includes the loopback circuit 180, the information management circuit 220, and a selector 340. The loopback circuit 180 may perform the loopback operation including feeding back, to the test equipment 170 (FIG. 1), signals or data received from the test equipment 170. The loopback circuit 180 will be used in a BER calculation and analysis for the memory device 110, in the test operation of the DRAM validity test. An output of the loopback circuit 180 may be selected by the test equipment 170 via the buffer chip 120. The output of the loopback circuit 180 may be output to the selector 340.

The information management circuit 220 may control or manage (for example, monitor or update) information of the memory device 110. The information management circuit 220 may measure a physical quantity of the memory device 110 or sense an operation status of the memory device 110, and may convert measured or sensed information into an electrical signal. The information of the memory device 110 may include information related to functions, features, and/or modes set in the memory device 110, information on an internal temperature of the memory device 110, and/or information on power required for operations of the memory device 110. The information management circuit 220 may include a mode register 310, a thermal sensor 320, and a power sensor 330.

The mode register 310 may allow functions, features, and/or modes of the memory device 110 to be programmed. The mode register 310 may be programmed by a mode register set (MRS) command, and may be programmed with user defined variables. The mode register 310 may be divided into various fields depending upon the functions, features, and/or modes. Since all registers of the mode register 310 have no defined default values, contents of the mode register 310 may be initialized. In other words, after power-up and/or a reset, the contents of the mode register 310 may be written. In addition, the contents of the mode register 310 may be changed due to re-execution of the MRS command during a normal operation. Thus, the functions, features, and/or modes of the memory device 110 may be updated.

For example, the mode register 310 may store data for controlling a burst length (BL), a read burst type (RBT), a column address strobe (CAS) latency (CL), a test mode, a delay-locked loop (DLL) reset, a write recovery and read command-to-precharge command features, use of DLL during precharge power down, a DLL enable/disable, an output drive intensity, an additive latency (AL), a write leveling enable/disable, a termination data strobe (TDQS) enable/disable, an output buffer enable/disable, a CAS write latency, a dynamic termination, a write cyclical redundancy check (CRC), a multi-purpose register (MPR) location function, an MPR operation function, a gear down mode, a per-DRAM addressing (PDA) mode, an MPR read format, a power down mode, a reference voltage (Vref) monitoring, a chip select (CS)-to-command/address latency mode, a read preamble training (RPT) mode, a read preamble function, a write preamble function, a command and address (C/A) parity function, a CRC error status, a CA parity error status, an on-die termination (ODT) input buffer power down function, a data mask function, a write data bus inversion (DBI) function, a read DBI function, a VrefDQ training value, a VrefDQ training range, VrefDQ training enable, a CAS-to-CAS command delay (tCCD) timing, an error detection clock (EDC) hold pattern, and the like.

The information on the functions, features, and/or modes of the memory device 110, which is stored in the mode register 310, may be selected by the memory controller 210 (FIG. 2) via the buffer chip 120. The information from the mode register 310 may be output to the selector 340.

The thermal sensor 320 may detect an internal temperature of the memory device 110. The thermal sensor 320 may include a circuit such as a thermal diode having a resistance value that varies with changes in the internal temperature of the memory device 110, or the like.

Figure 4:
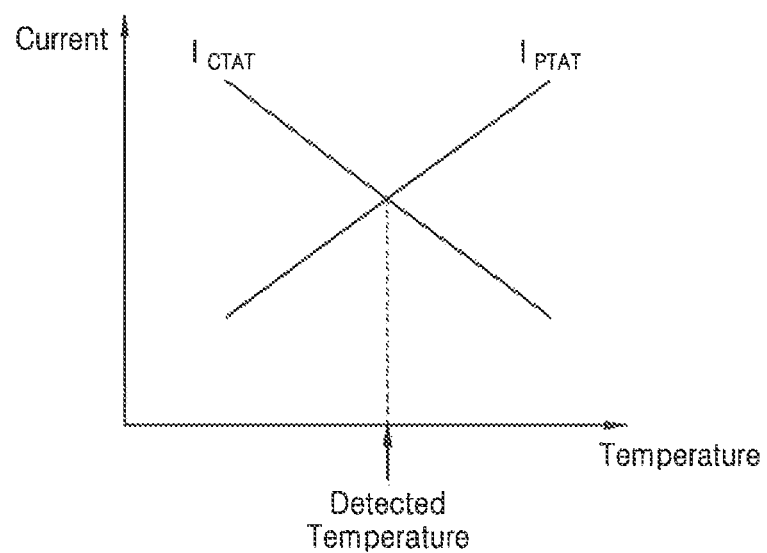
FIG. 4 is a graph depicting a characteristic of a thermal sensor of FIG. 3, according to an exemplary embodiment of the inventive concept.

For example, the thermal sensor 320 may use a proportional-to-absolute-temperature (PTAT) current generator and a complementary-to-absolute-temperature (CTAT) current generator. As shown in FIG. 4, the thermal sensor 320 may detect the internal temperature at a point at which a current $I_{PTAT}$ of the PTAT current generator is equal to a current $I_{CTAT}$ of the CTAT current generator. Information on the internal temperature of the memory device 110 detected by the thermal sensor 320 may be output to the selector 340.

The power sensor 330 may sense power of the memory device 110. The power sensor 330 may sense at least one of a current value and a power value, which are input to the memory device 110. For example, the power sensor 330 may include at least one device and/or component capable of measuring a current value input to the memory device 110. Alternatively, the power sensor 330 may further include at least one device and/or component capable of measuring a voltage value input to the memory device 110.

The power sensor 330 may obtain a power value input to the memory device 110 by calculating the measured current value and the measured voltage value. The power sensor 330 may further include a register capable of storing each of the current value and the voltage value for the calculation or a register capable of storing the power value that is a calculation result. According to an exemplary embodiment of the inventive concept, the power sensor 330 may sense at least one of the current value and the power value by sampling a signal input to the memory device 110. The power information of the memory device 110, which is sensed by the power sensor 330, may be output to the selector 340.

The selector 340 may receive the output of the loopback circuit 180, the information of the mode register 310, the internal temperature information of the thermal sensor 320, and the power information of the power sensor 330. In response to the test equipment 170 or the memory controller 210 via the buffer chip 120, the selector 340 may select and transmit one of the output of the loopback circuit 180, the information of the mode register 310, the internal temperature information of the thermal sensor 320, and the power information of the power sensor 330 to the loopback bus 140.

The selector 340 may transmit the output of the loopback circuit 180 to the loopback bus 140, in the test operation of the DRAM validity test for the memory module 100 instructed by the test equipment 170. In response to the output of the loopback circuit 180, the test equipment 170 will perform the BER calculation and analysis functions for the memory device 110.

During the data processing operation for the memory module 100 instructed by the memory controller 210, the selector 340 may transmit, to the loopback bus 140, information selected from among the information of the mode register 310, the internal temperature information of the thermal sensor 320, and the power information of the power sensor 330. Here, the memory controller 210 may control a write or read operation for the memory device 110.

Referring again to FIG. 2, the loopback bus 140 may be connected to the loopback channel 150 and the memory controller 210 via the buffer chip 120. The memory controller 210 may monitor an operation status of the memory device 110 and the memory module 100 by using the information of the mode register 310, the internal temperature information of the thermal sensor 320, or the power information of the power sensor 330, which is received via the loopback channel 150. The memory controller 210 may monitor the information of the memory device 110 via the loopback channel 150 in real time while performing the data processing operation according to the write or read operation of the memory device 110. Thus, since the memory controller 210 monitors the information of the memory device 110 in real time, the memory controller 210 may accurately provide a normal operation environment of the memory module 100.

For example, the memory controller 210 may determine an internal temperature of the memory device 110 using the internal temperature information of the thermal sensor 320, compare the internal temperature with a critical temperature, and control at least one of hardware and applications in a system according to a result of the comparison. For example, if the internal temperature is greater than the critical temperature, the memory controller 210 may reduce the temperature of the memory device 110 by increasing a rotation speed of a cooling fan in the system. The critical temperature may be set to allow the memory device 110 to normally operate.

For example, if the memory controller 210 determines that a power value, which is based on the power information of the power sensor 330 of the memory device 110, is greater than or less than a critical power value, the memory controller 210 may provide power required for operations of the memory device 110 to the memory device 110 by controlling a power module in the system. The critical power value may be set to allow the memory device 110 to normally operate.

According to an exemplary embodiment of the inventive concept, the memory controller 210 may access each of the memory devices 111 to 119, and thus, control a write or read operation for each accessed or target memory device 11 to 119. For example, the memory controller 210 may monitor the information of the mode register 310 of a non-target memory device 110 that is not accessed, the internal temperature information of the thermal sensor 320 thereof, and the power information of the power sensor 330 thereof via the loopback channel 150. The memory controller 210 may monitor the information of the non-target memory device 110 by using the per-DRAM addressing (PDA) mode of the mode register 310 of the non-target memory device 110. The memory controller 210 may enable the PDA mode of the mode register 310 of the non-target memory device 110, and may receive the information of the mode register 310 of the non-target memory device 110, the internal temperature information of the thermal sensor 320 thereof, and the power information of the power sensor 330 thereof via the loopback channel 150.

Figure 5:
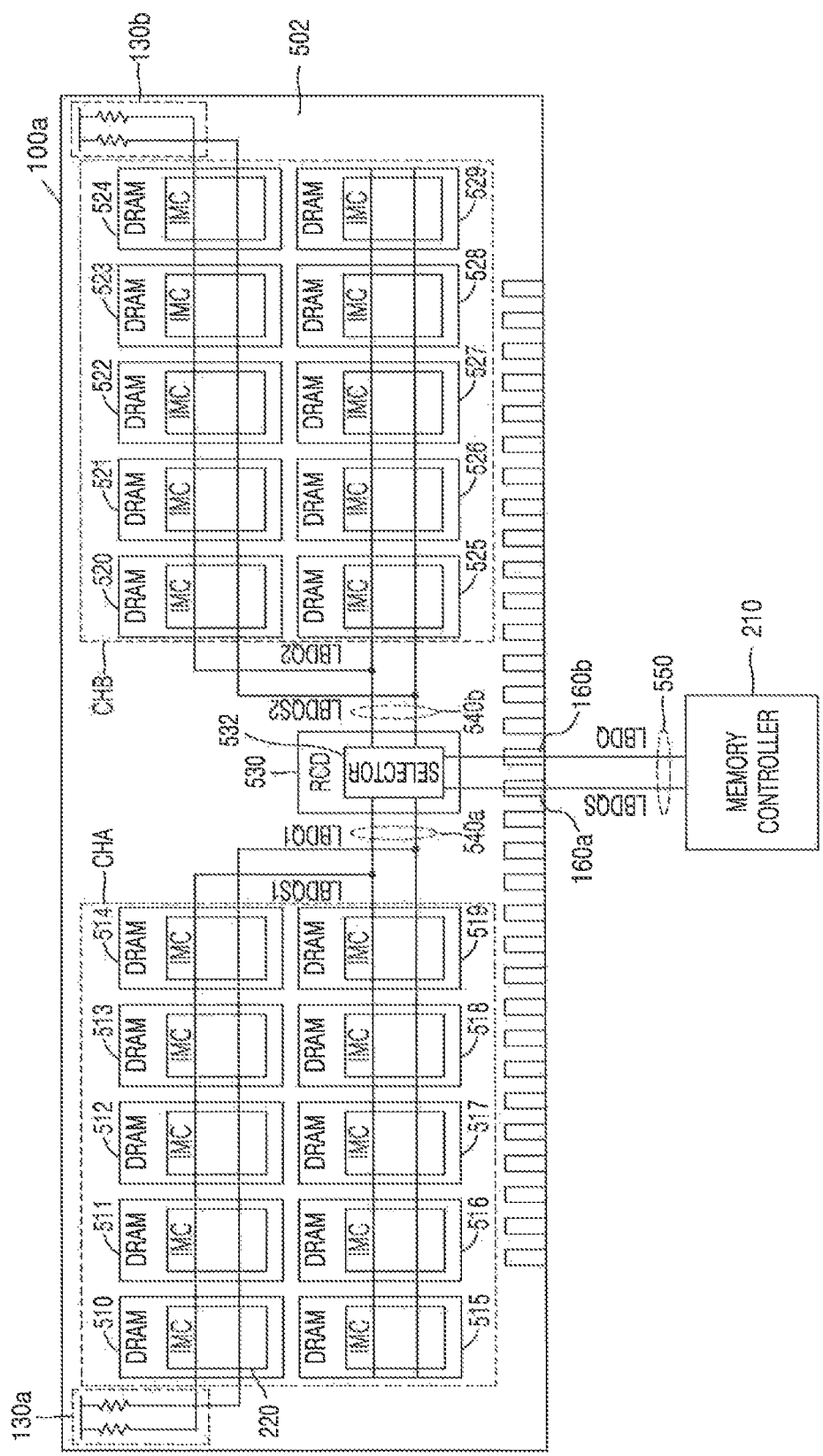
FIG. 5 is a block diagram illustrating a memory module including a memory device, according to an exemplary embodiment of the inventive concept.

FIG. 5 is a block diagram illustrating a memory module including a memory device, according to an exemplary embodiment of the inventive concept.

Referring to FIG. 5, a memory module 100a may include memory devices 510, 511, 512, 513, 514, 515, 516, 517, 518 and 519 belonging to a first channel CHA, memory devices 520, 521, 522, 523, 524, 525, 526, 527, 528 and 529 belonging to a second channel CHB, and a buffer chip 530, in a printed circuit board 502. The first channel CHA and the second channel CHB may respectively constitute independent interfaces, and may be independently controlled by the memory controller 210 via the buffer chip 530.

Identically to the memory device 110 described with reference to FIG. 3, each of the memory devices 510 to 529 may include the loopback circuit 180 and the information management circuit 220. The loopback circuit 180 (FIG. 3) may perform the loopback operation that includes feeding back, to the test equipment 170 (FIG. 1), first and second loopback signals LBDQS1, and LBDQ1, first and second loopback signals LBDQS2, and LBDQ2 provided from the memory devices 510 to 529. The information management circuit 220 (FIG. 3) may provide, to the memory controller 210, the information set in the mode register 310 of each of the memory devices 510 to 529, the information on the internal temperature detected by the thermal sensor 320 in each of memory devices 510 to 529, or the information on the power sensed by the power sensor 330 in each of memory devices 510 to 529.

The memory devices 510 to 519 of the first channel CHA may be connected to the buffer chip 530 via a first loopback bus 540a, and the memory devices 520 to 529 of the second channel CHB may be connected to the buffer chip 530 via a second loopback bus 540b.

During a test operation for a DRAM validity test of the memory module 100a, the first loopback bus 540a may be connected to the test equipment 170 via the buffer chip 530 and a loopback channel 550, and the second loopback bus 540b may be connected to the test equipment 170 via the buffer chip 530 and the loopback channel 550. The buffer chip 530 may include a selector 532 for selectively connecting the first loopback bus 540a and the second loopback bus 540b to the loopback channel 550.

When the first loopback bus 540a is connected to the loopback channel 550 by the selector 532, the test equipment 170 may send the first and second loopback signals LBDQS1 and LBDQ1 to the memory devices 510 to 519 of the first channel CHA and immediately read back the first and second loopback signals LBDQS1 and LBDQ1. When the second loopback bus 540b is connected to the loopback channel 550 by the selector 532, the test equipment 170 may send the first and second loopback signals LBDQS2 and LBDQ2 to the memory devices 520 to 529 of the second channel CHB and immediately read back the first and second loopback signals LBDQS2 and LBDQ2.

The test equipment 170 may complete the DRAM validity test for the first channel CHA by performing the BER calculation and analysis of the memory devices 510 to 519 of the first channel CHA based on the read-back first and second loopback signals LBDQS1 and LBDQ1. The test equipment 170 may complete the DRAM validity test for the second channel CHB by performing the BER calculation and analysis of the memory devices 520 to 529 of the second channel CHB based on the read-back first and second loopback signals LBDQS2 and LBDQ2.

During the data processing operation for the memory module 100a by using the memory controller 210, the memory controller 210 may independently perform the data processing operation for the memory devices 510 to 519 of the first channel CHA, and the data processing operation for the memory devices 520 to 529 of the second channel CHB.

When the first loopback bus 540a is connected to the loopback channel 550 by the selector 532, the first loopback bus 540a may be connected to the memory controller 210 via the loopback channel 550. The memory controller 210 may receive, via the first loopback bus 540a and the loopback channel 550, information of a memory device selected from among the memory devices 510 to 519 of the first channel CHA.

When the second loopback bus 540b is connected to the loopback channel 550 by the selector 532, the second loopback bus 540b may be connected to the memory controller 210 via the loopback channel 550. The memory controller 210 may receive, via the second loopback bus 540b and the loopback channel 550, information of a memory device selected from among the memory devices 520 to 529 of the second channel CHB.

The memory controller 210 may monitor an operation status of the first channel CHA, the second channel CHB, and the memory module 100a by using the information of the mode register 310, the internal temperature information of the thermal sensor 320, or the power information of the power sensor 330, which is received via the loopback channel 150 and pertains to the memory device 510 to 519 selected from the first channel CHA or pertains to the memory device 520 to 529 selected from the second channel CHB. The memory controller 210 may monitor information of the first channel CHA and the second channel CHB via the loopback channel 150 in real time while performing the data processing operation according to a write or read operation of the first channel CHA and the second channel CHB. Thus, the memory controller 210 may control at least one of hardware and applications in a system, thereby accurately providing a normal operation environment of the memory module 100a in real time.

Figure 6:
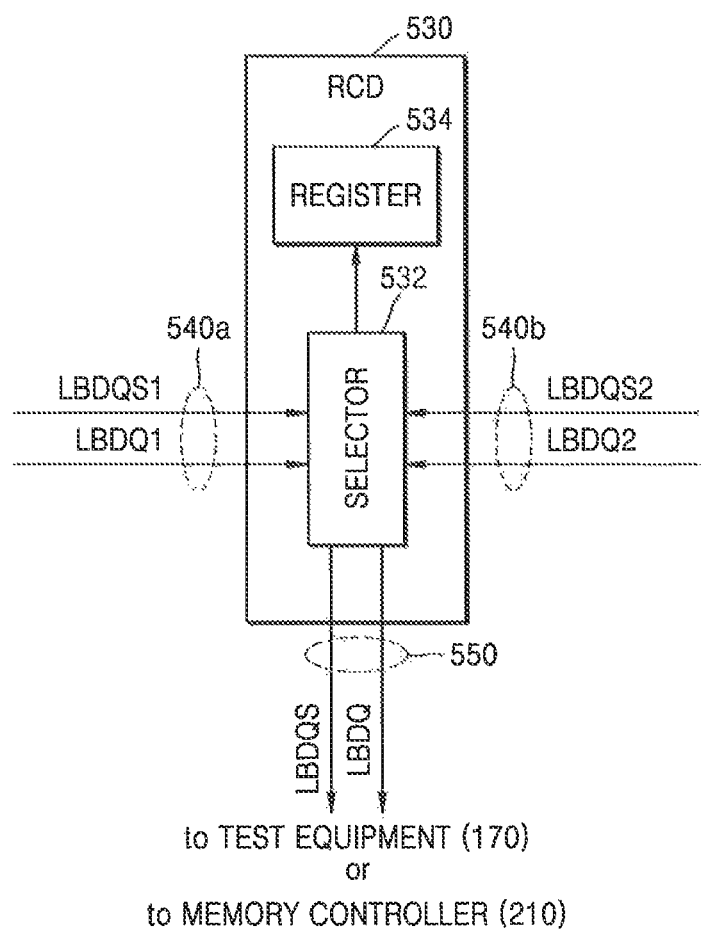
FIG. 6 is a diagram illustrating a buffer chip of FIG. 5, according to an exemplary embodiment of the inventive concept.

FIG. 6 is a diagram illustrating the buffer chip 530 of FIG. 5, according to an exemplary embodiment of the inventive concept.

Referring to FIG. 6, the buffer chip 530 may include the selector 532 for selectively connecting the first loopback bus 540a and the second loopback bus 540b to the loopback channel 550, and a register 534.

During the test operation of the memory module 100a, the selector 532 may transmit, to the test equipment 170, the first and second loopback signals LBDQS1 and LBDQ1 which are transmitted to the first loopback bus 540a and used for the BER calculation and analysis of the memory devices 510 to 519 of the first channel CHA. Alternatively, during the test operation of the memory module 100a, the selector 532 may transmit, to the test equipment 170, the first and second loopback signals LBDQS2 and LBDQ2 which are transmitted to the second loopback bus 540b and used for the BER calculation and analysis of the memory devices 520 to 529 of the second channel CHB.

During the test operation of the memory module 100a, the selector 532 may store, in the register 534, the information of the mode register 310, the internal temperature information of the thermal sensor 320, or the power information of the power sensor 330, which is transmitted to the first loopback bus 540a and pertains to each of the memory devices 510 to 519 selected from the first channel CHA. In addition, the selector 532 may store, in the register 534, the information of the mode register 310, the internal temperature information of the thermal sensor 320, or the power information of the power sensor 330, which is transmitted to the second loopback bus 540b and pertains to each of the memory devices 520 to 529 selected from the second channel CHB.

The selector 532 may select one of the information of the mode register 310, the internal temperature information of the thermal sensor 320, and the power information of the power sensor 330, which are stored in the register 534 and pertain to each of the memory devices 510 to 519 selected from the first channel CHA. Alternatively, the selector 532 may select one of the information of the mode register 310, the internal temperature information of the thermal sensor 320, and the power information of the power sensor 330, which are stored in the register 534 and pertain to each of the memory devices 520 to 529 selected from the second channel CHB. The selector 532 may transmit the selected information to the memory controller 210 via the loopback channel 550. The memory controller 210 may monitor the operation status of the first channel CHA, the second channel CHB, and the memory module 100a via the loopback channel 550.

Figure 7:
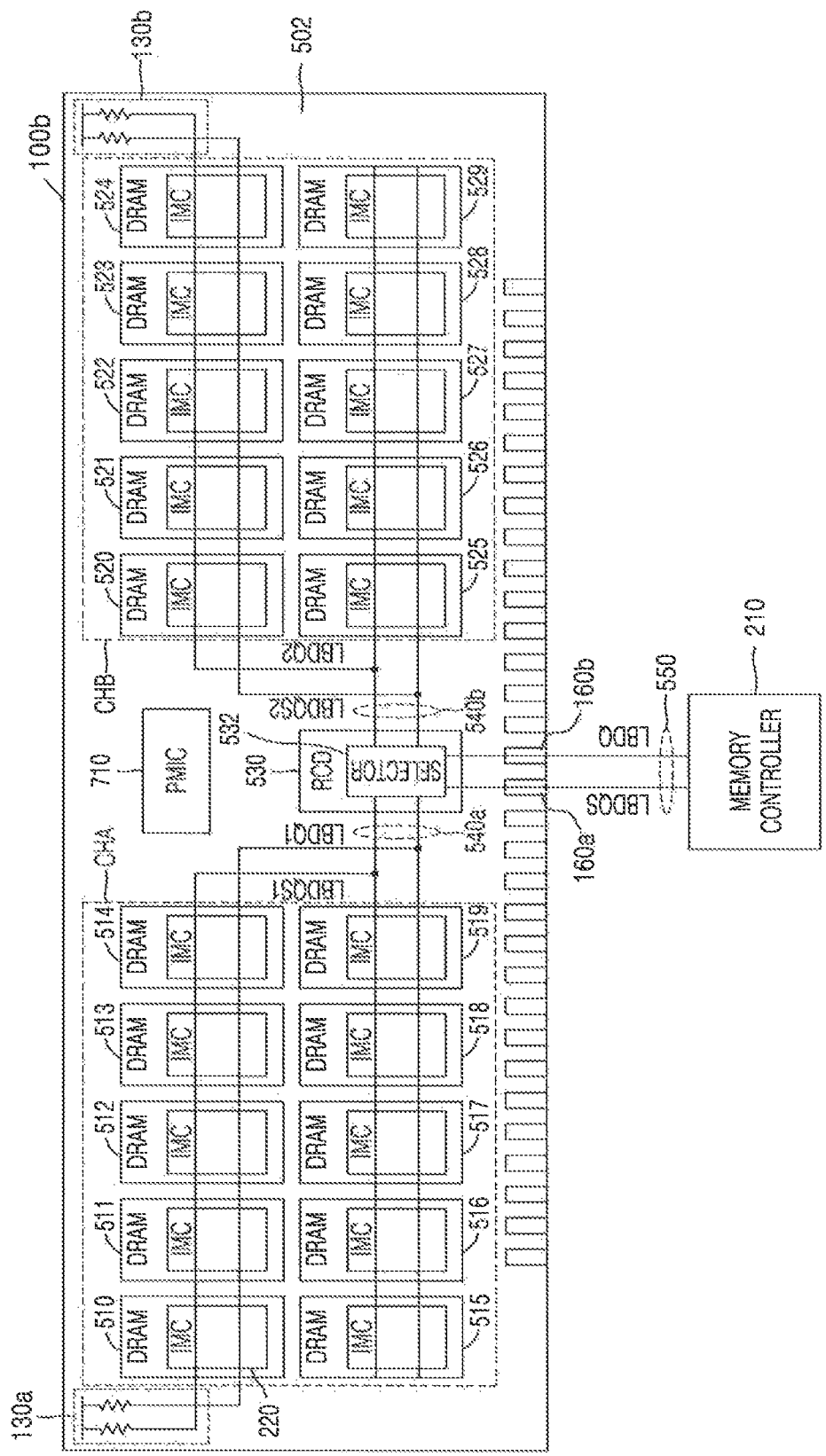
FIG. 7 is a block diagram illustrating a memory module including a memory device, according to an exemplary embodiment of the inventive concept.

FIG. 7 is a block diagram illustrating a memory module including a memory device, according to an exemplary embodiment of the inventive concept.

Referring to FIG. 7, a memory module 100b is different from the memory module 100a of FIG. 5 in that the memory module 100b further includes a power management integrated circuit (PMIC) 710. The other components of the memory module 100b are substantially identical to those of the memory module 100a. Hereinafter, the difference from the memory module 100a of FIG. 5 will be mainly described.

The PMIC 710 of the memory module 100b may manage power input to the memory module 100b and output the power to the memory devices 510 to 529 and the buffer chip 530. The PMIC 710 may sense an incoming power value, compare the sensed power value with a critical power value, and regulate the power output to the memory devices 510 to 529 and the buffer chip 530 according to a result of the comparison. For example, if excessive power is applied to the memory module 100b, the memory module 100b may abnormally operate, or the quality of the memory module 100b may be adversely affected. Thus, a power value allowable for the memory module 100b to normally operate or for a normal operation of an electronic device in which the memory module 100b is installed, in other words, the critical power value, may be set in the PMIC 710.

The PMIC 710 may compare the power value coming into the memory module 100b with the critical power value, and may transmit the comparison result to the loopback channel 550 via the buffer chip 530. The PMIC 710 may be connected to the buffer chip 530 by using an internal wiring layer of the printed circuit board 502. The memory controller 210 may control at least one of hardware and applications in a system by using the comparison result transmitted to the loopback channel 550, thereby controlling the power value coming into the memory module 100b. For example, if the PMIC 710 determines that the power value coming into the memory module 100b is greater than or less than the critical power value, the memory controller 210 may provide power required for operations of the memory module 100b to the memory module 100b by controlling a power module in the system.

The PMIC 710 may regulate power provided to each of the memory devices 510 to 519 of the first channel CHA by using the power information of the power sensor 330 (FIG. 3) provided from each of the memory devices 510 to 519 of the first channel CHA. The power information may be stored in the register 534 (FIG. 6) of the buffer chip 530. In addition, the PMIC 710 may regulate power provided to each of the memory devices 520 to 529 of the second channel CHB by using the power information of the power sensor 330 (FIG. 3) provided from each of the memory devices 520 to 529 of the second channel CHB. The power information may be stored in the register 534 of the buffer chip 530.

Figure 8:
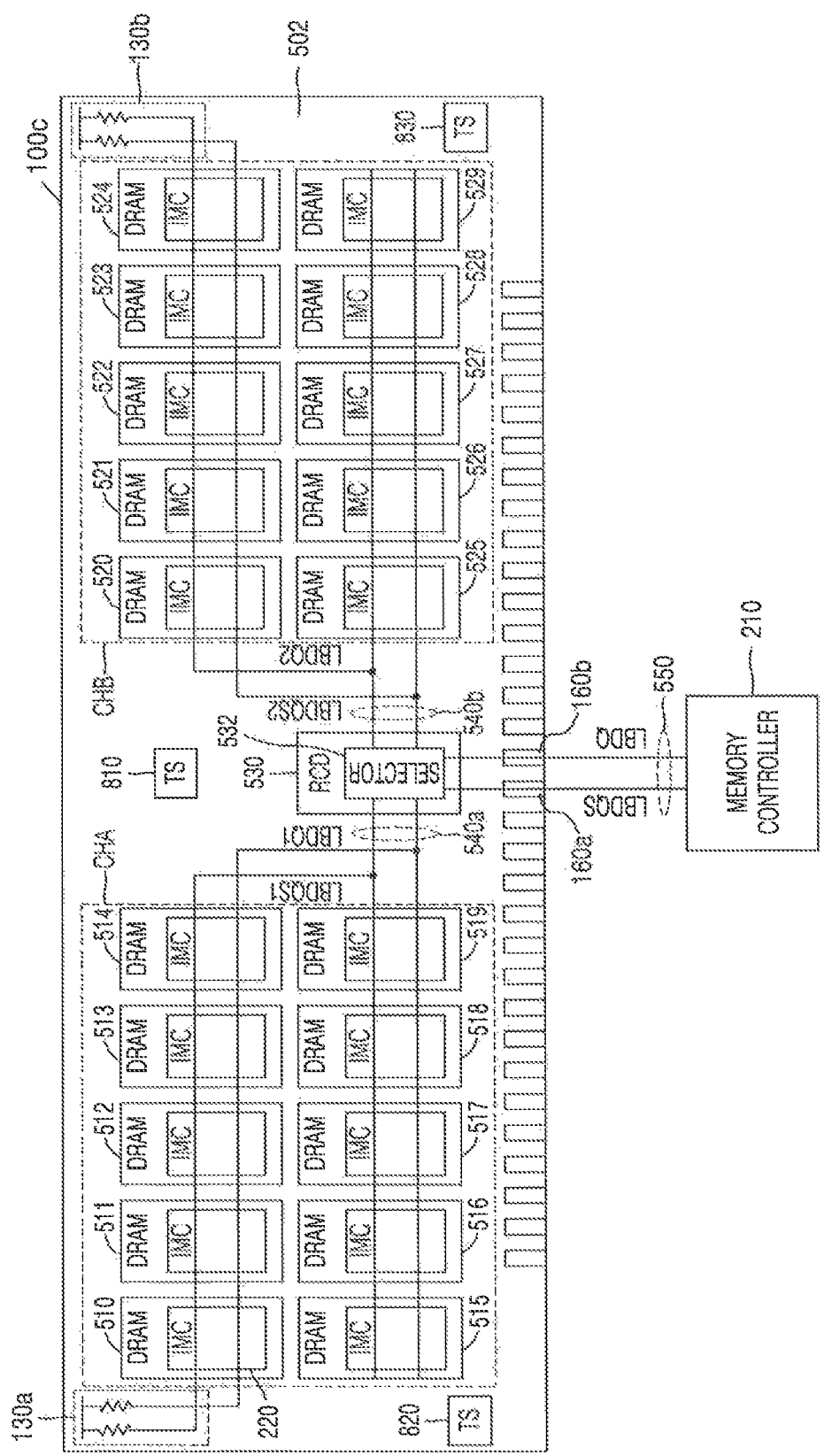
FIG. 8 is a block diagram illustrating a memory module including a memory device, according to an exemplary embodiment of the inventive concept.

FIG. 8 is a block diagram illustrating a memory module including a memory device, according to an exemplary embodiment of the inventive concept.

Referring to FIG. 8, a memory module 100c is different from the memory module 100a of FIG. 5 in that the memory module 100c further includes a plurality of thermal sensors 810, 820, and 830 in the printed circuit board 502. The other components of the memory module 100c are substantially identical to those of the memory module 100a. Hereinafter, the difference from the memory module 100a of FIG. 5 will be mainly described.

The plurality of thermal sensors 810, 820, and 830 may each be arranged in a central region of the printed circuit board 502 or at an edge of the printed circuit board 502, and may measure a temperature of the memory module 100c. The plurality of thermal sensors 810, 820, and 830 may each be connected to the buffer chip 530 by using the internal wiring layer of the printed circuit board 502. The buffer chip 530 may receive temperature information from each of the thermal sensors 810, 820, and 830. In the present embodiment, although the memory module 100c is shown as including the three thermal sensors 810, 820, and 830, the memory module 100c may include various numbers of thermal sensors. For example, the memory module 100c may include less than three thermal sensors or more than three thermal sensors.

The buffer chip 530 may transmit the received temperature information of each of the thermal sensors 810, 820, and 830 to the memory controller 210 via the loopback channel 550. A temperature allowable for the memory module 100c to normally operate, or for a normal operation of an electronic device in which the memory module 100c is installed, in other words, a critical temperature, may be set in the memory controller 210. The memory controller 210 may compare the measured temperature with the critical temperature, and may control at least one of hardware and applications in the system. For example, if the measured temperature is greater than the critical temperature, the memory controller 210 may reduce the temperature of the memory module 100c by increasing a rotation speed of a cooling fan in the system.

Figure 9:
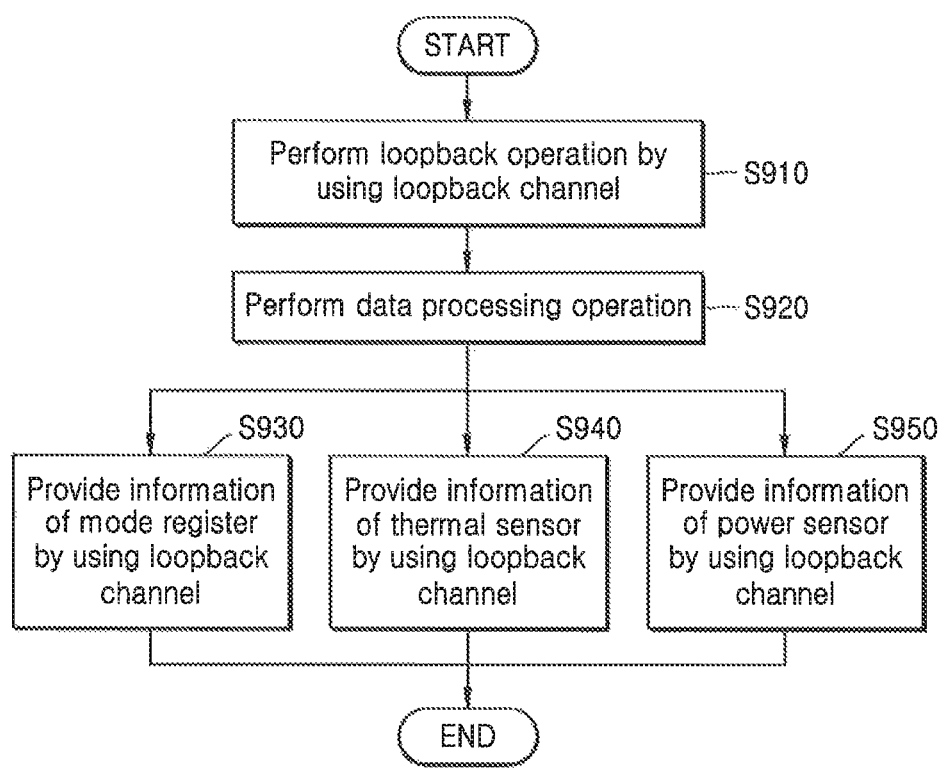
FIG. 9 is a flowchart illustrating a method of operating a memory module including a memory device, according to an exemplary embodiment of the inventive concept.

FIG. 9 is a flowchart illustrating a method of operating a memory module including a memory device, according to an exemplary embodiment of the inventive concept.

Referring to FIG. 9 in conjunction with FIGS. 1 to 3, in operation S910, in the test operation for the DRAM validity test of the memory module 100 by using the test equipment 170, the memory devices 110 to 119 may perform the loopback operation including feeding back, to the test equipment 170, the signal or data received from the test equipment 170, by using the loopback channel 150. The loopback operation may include: receiving, by the loopback circuit 180 (FIG. 3) of each of the memory devices 110 to 119, the first and second loopback signals LBDQS and LBDQ, and feeding back, to the test equipment 170 (FIG. 1), the received first and second loopback signals LBDQS and LBDQ; and immediately reading back, by the test equipment 170, the fed-back data. The test equipment 170 may perform the BER calculation for each of the memory devices 110 to 119 based on the first and second loopback signals LBDQS and LBDQ read back from their respective loopback circuits 180 (FIG. 3). The test equipment 170 may perform the BER analysis based on the results of the BER calculation obtained from all of the memory devices 110 to 119 of the memory module 100, and may complete the DRAM validity test by the BER analysis.

In operation S920, the memory controller 210 may perform the data processing operation for the memory module 100. The data processing operation may include a write operation and/or a read operation performed for each target memory device 110 to 119 via the buffer chip 120.

In operation S930, while the data processing operation for the memory module 100 is performed (S920), the information on the functions, features, and/or modes of the memory devices 110 to 119 may be provided to the memory controller 210 via the loopback channel 150. This information may be stored in the mode register 310 of each of the memory devices 110 to 119.

In operation S940, while the data processing operation for the memory module 100 is performed (S920), the internal temperature information detected by the thermal sensor 320 of each of the memory devices 110 to 119 may be provided to the memory controller 210 via the loopback channel 150.

In operation S950, while the data processing operation for the memory module 100 is performed (S920), the power information detected by the power sensor 330 of each of the memory devices 110 to 119 may be provided to the memory controller 210 via the loopback channel 150.

By operations S930, S940, and S950, the memory controller 210 may monitor the operation status of, for example, the memory device 110 and the memory module 100 in real time by using the information of the mode register 310 of the memory device 110, the internal temperature information of the thermal sensor 320 of the memory device 110, or the power information of the power sensor 330 of the memory device 110, which is received via the loopback channel 150. Thus, the memory controller 210 may accurately control the normal operation environment of the memory module 100 in real time.

Figure 10:
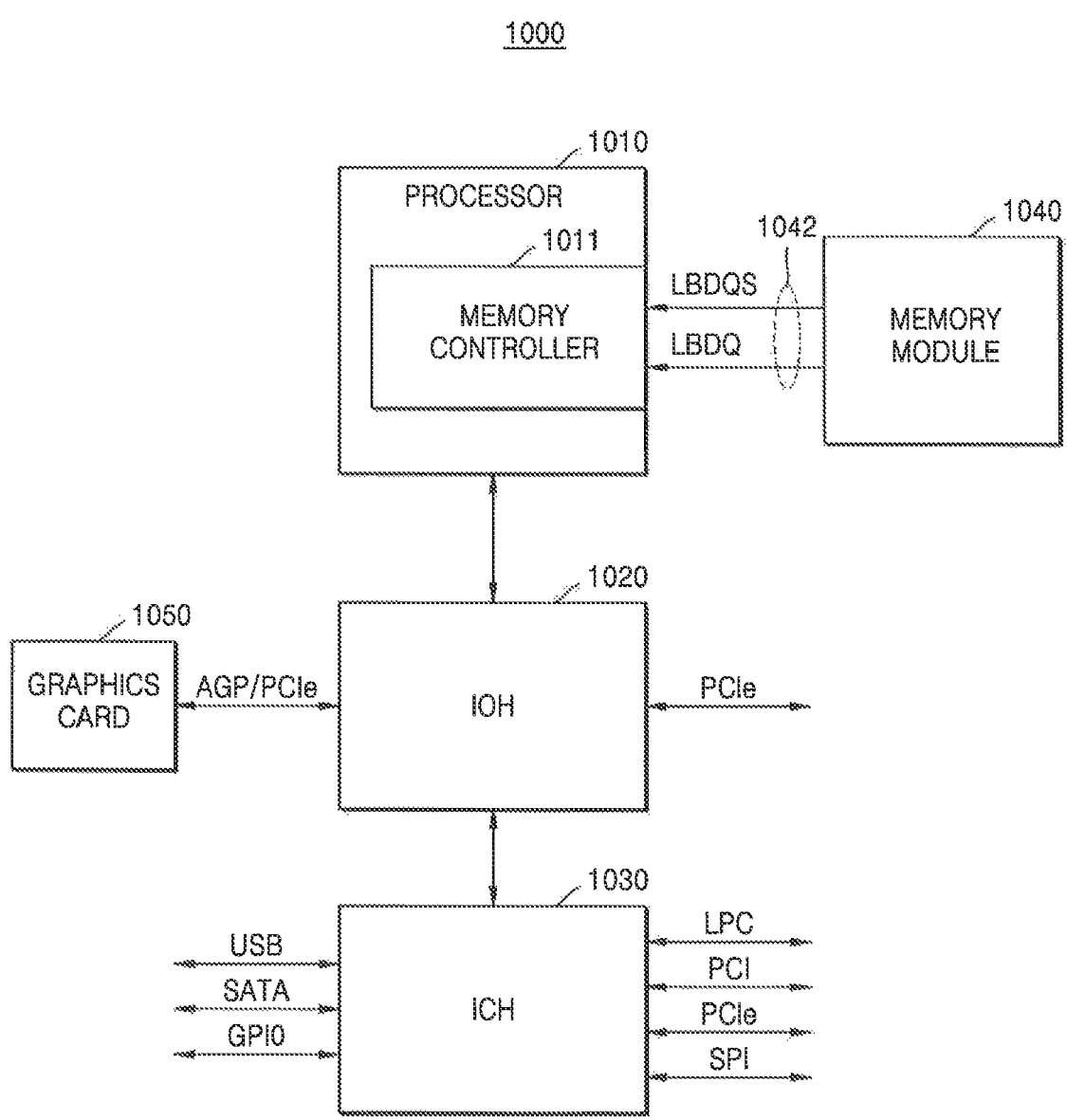
FIG. 10 is a block diagram illustrating the application of a memory module, according to an exemplary embodiment of the inventive concept, to a computing system.

FIG. 10 is a block diagram illustrating the application of a memory module, according to an exemplary embodiment of the inventive concept, to a computing system.

Referring to FIG. 10, a computing system 1000 includes a processor 1010, an input/output hub 1020, an input/output controller hub 1030, a memory module 1040, and a graphics card 1050. According to an exemplary embodiment of the inventive concept, the computing system 1000 may be any computing system, such as a personal computer (PC), a server computer, a workstation, a laptop, a mobile phone, a smart phone, a personal digital assistant (PDA), a portable multimedia player (PMP), a digital camera, a digital television, a set-top box, a music player, a portable game console, a navigation system, or the like.

The processor 1010 may execute various computing functions such as specific calculations or tasks. For example, the processor 1010 may be a microprocessor or a central processing unit (CPU). According to an exemplary embodiment of the inventive concept, the processor 1010 may include a single processor core (e.g., single core) or a plurality of processor cores (e.g., multi-core). For example, the processor 1010 may include dual cores (e.g., dual-core), quadruple cores (e.g., quad-core), hextuple cores (e.g., hexa-core), or the like. In addition, although FIG. 10 illustrates the computing system 1000 including one processor 1010, the computing system 1000 may include a plurality of processors. In addition, according to an exemplary embodiment of the inventive concept, the processor 1010 may further include cache a memory located inside or outside thereof.

The processor 1010 may include a memory controller 1011 for controlling operations of the memory module 1040. The memory controller 1011 included in the processor 1010 may be an integrated memory controller (IMC). According to an exemplary embodiment of the inventive concept, the memory controller 1011 may be located in the input/output hub 1020. The input/output hub 1020 including the memory controller 1011 may be a memory controller hub (MCH). According to an exemplary embodiment of the inventive concept, the memory controller 1011 may be implemented with a separate device from the processor 1010 or the input/output hub 1020.

The memory controller 1011 and the memory module 1040 may constitute a memory system. The memory controller 1011 may be connected to the memory module 1040 via a loopback channel 1042, via which the first and second loopback signals LBDQS and LBDQ used for a validity test of memory devices mounted in the memory module 1040 are transmitted. During the data processing operation for the memory module 1040, the memory controller 1011 may receive, via the loopback channel 1042 in real time, information on functions, features or modes stored in a mode register of a selected memory device, information on an internal temperature detected by a thermal sensor of the selected memory device, or information on power sensed by a power sensor of the selected memory device. The memory controller 1011 may monitor, in real time, the received information on the functions, features or modes stored in the mode register, the received information on the internal temperature detected by the thermal sensor, or the received information on the power sensed by the power sensor, thereby accurately providing a normal operation environment of the memory module 1040 by controlling at least one of hardware and applications in the system.

The input/output hub 1020 may manage data transmission between the processor 1010 and devices such as the graphics card 1050. The input/output hub 1020 may be connected to the processor 1010 via interfaces of various types. For example, the input/output hub 1020 may be connected to the processor 1010 by various standard interfaces, such as a Front Side Bus (FSB), a System Bus, HyperTransport, Lightning Data Transport (LDT), QuickPath Interconnect (QPI), a common system interface, Peripheral Component Interface-Express (PCIe), or the like. Although FIG. 10 illustrates the computing system 1000 including one input/output hub 1020, the computing system 1000 may include a plurality of input/output hubs.

The input/output hub 1020 may provide various interfaces with devices. For example, the input/output hub 1020 may provide an Accelerated Graphics Port (AGP) interface, a Peripheral Component Interface-Express (PCIe) interface, a Communications Streaming Architecture (CSA) interface, or the like.

The graphics card 1050 may be connected to the input/output hub 1020 via an AGP or PCIe interface. The graphics card 1050 may control a display device for displaying images. The graphics card 1050 may include an internal processor for image data processing, and an internal semiconductor memory device. According to an exemplary embodiment of the inventive concept, the computing system 1000 may include the input/output hub 1020 and the graphics card 1050 located outside the input/output hub 1020, or may include, instead of the graphics card 1050, the input/output hub 1020 including its own graphics device. The graphics device included in the input/output hub 1020 may be an integrated graphics device. In addition, the input/output hub 1020 including a memory controller and a graphics device may be a graphics and memory controller hub (GMCH).

The input/output controller hub 1030 may perform data buffering and interface arbitration such that various system interfaces are efficiently operated along with the computing system 1000. The input/output controller hub 1030 may be connected to the input/output hub 1020 via an internal bus. For example, the input/output controller hub 1030 may be connected to the input/output hub 1020 via a Direct Media Interface (DMI), a hub interface, an Enterprise Southbridge Interface (ESI), a PCIe, or the like.

The input/output controller hub 1030 may provide various interfaces with peripheral devices. For example, the input/output controller hub 1030 may provide a Universal Serial Bus (USB) port, a Serial Advanced Technology Attachment (SATA) port, General Purpose Input/Output (GPIO), a Low Pin Count (LPC) bus, a Serial Peripheral Interface (SPI), a PCI, a PCIe, or the like.

According to an exemplary embodiment of the inventive concept, two or more components among the processor 1010, the input/output hub 1020, and the input/output controller hub 1030 may be implemented as one chipset.

Figure 11:
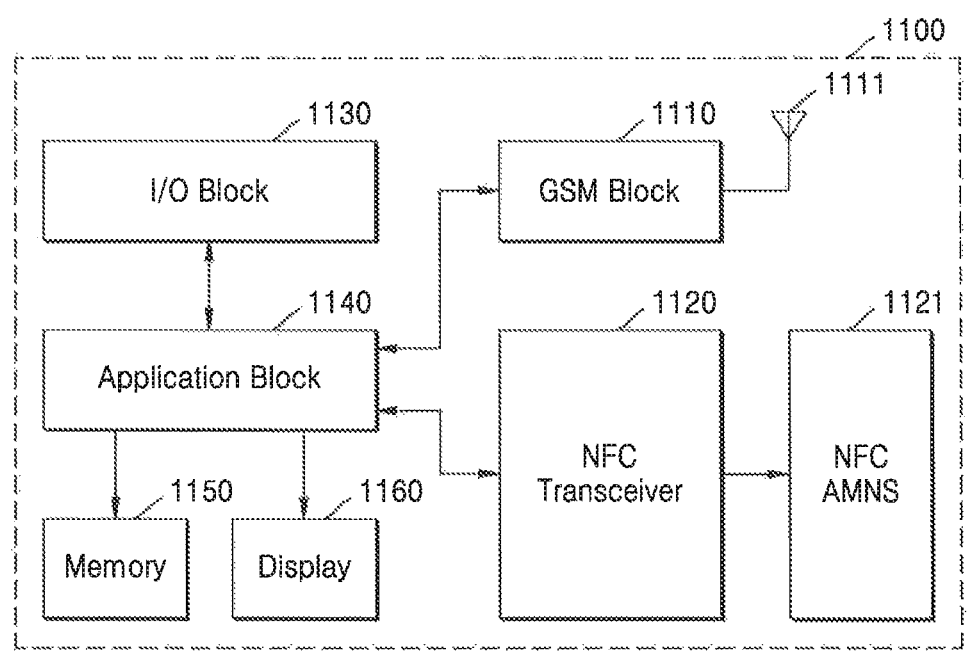
FIG. 11 is a block diagram illustrating the application of a memory module, according to an exemplary embodiment of the inventive concept, to a mobile device.

FIG. 11 is a block diagram illustrating the application of a memory module, according to an exemplary embodiment of the inventive concept, to a mobile device. The mobile device may be a mobile phone or a smart phone.

Referring to FIG. 11, a mobile device 1100 includes a Global System for Mobile Communications (GSM) block 1110, a Near Field Communications (NFC) transceiver 1120, an input/output block 1130, an application block 1140, a memory 1150, and a display 1160. The mobile device 1100 may further include an NFC antenna matching network system 1121 and an antenna 1111. In FIG. 11, components/blocks of the mobile device 1100 are illustrated as examples. For example, the mobile device 1100 may include more or less components/blocks than shown in FIG. 11. In addition, although it is illustrated that GSM technology is used in the present embodiment, the mobile device 1100 may be implemented by using other technologies such as Code Division Multiple Access (CDMA). The blocks of FIG. 11 may be implemented as an integrated circuit. Alternatively, some of the blocks of FIG. 11 may be implemented as an integrated circuit, whereas other blocks may be separately implemented.

The GSM block 1110 may be connected to the antenna 1111, and may be operated to provide a wireless phone operation. The GSM block 1110 may include a receiver and a transmitter internal thereto, and thus, perform corresponding receive and transmit operations.

The NFC transceiver 1120 may be configured to transmit and receive NFC signals by using inductive coupling, for wireless communication. The NFC transceiver 1120 may provide NFC signals to the NFC antenna matching network system 1121, and the NFC antenna matching network system 1121 may transmit the NFC signals by inductive coupling. The NFC antenna matching network system 1121 may receive NFC signals provided from another NFC device, and provide the received NFC signals to the NFC transceiver 1120.

The application block 1140 may include hardware circuits, for example, one or more processors, and may be operated to provide various user applications provided by the mobile device 1100. The user applications may include voice call operations, data transmission, data swapping, and the like. The application block 1140 may be operated together with the GSM block 1110 and/or the NFC transceiver 1120, thereby providing operation features of the GSM block 1110 and/or the NFC transceiver 1120. Alternatively, the application block 1140 may include a program for mobile point-of-sales (POS). Such a program may provide credit card purchase and payment functions using a mobile phone, in other words, a smart phone.

The display 1160 may display images in response to display signals received from the application block 1140. The images may be provided from the application block 1140, or created by a camera embedded in the mobile device 1100. The display 1160 may include a frame buffer internal thereto for temporary storage of pixel values, and may include a liquid crystal display screen together with related control circuits.

The input/output block 1130 provides an input function to a user, and provides outputs which are to be received via the application block 1140.

The memory 1150 may store programs (e.g., commands) and/or data which are to be used by the application block 1140, and may be implemented with RAM, read only memory (ROM), flash memory, or the like. Thus, the memory 1150 may include volatile and non-volatile storage devices. For example, the memory 1150 may include the memory module 100, 100a, 100b, or 100c described with reference to FIGS. 1 to 9.

The memory 1150 may include a memory controller 210 and a memory module 100, 100a, 100b, or 100c. The memory controller may be connected to the memory module via a loopback channel 150, via which first and second loopback signals LBDQS and LBDQ are transmitted. The first and second loopback signals LBDQS and LBDQ may be used for a validity test of memory devices, e.g., 110 to 119, mounted in the memory module 100, 100a, 100b, or 100c. During a data processing operation for the memory module 100, 100a, 100b, or 100c, the memory controller 210 may receive, via the loopback channel 150 in real time, information on functions, features or modes stored in a mode register, e.g., 310, of a memory device, e.g., 110, information on an internal temperature detected by a thermal sensor, e.g., 320, of the memory device 110, or information on power sensed by a power sensor, e.g., 330, of the memory device 110. The memory controller 210 may monitor, in real time, the received information on the functions, features or modes stored in the mode register 310, the received information on the internal temperature detected by the thermal sensor 320, or the received information on the power sensed by the power sensor 330, thereby providing a normal operation environment of the memory module 100, 100a, 100b, or 100c by controlling at least one of hardware and applications in a system.

While the inventive concept has been particularly shown and described with reference to exemplary embodiments thereof, it will be understood by one of ordinary skill in the art that various changes in form and details may be made therein without departing from the spirit and scope of the inventive concept as defined by the following claims.

What is claimed is:

1. A memory module, comprising:
   a printed circuit board;
   connectors disposed on the printed circuit board;
   a plurality of memory devices mounted to the printed circuit board; and
   a buffer chip mounted to the printed circuit board, wherein the buffer chip provides, to the plurality of memory devices, signals that were provided to the connectors of the printed circuit board,
   wherein each of the plurality of memory devices comprises:
   a loopback circuit for performing a loopback operation, wherein the loopback operation comprises receiving, via the buffer chip, test signals provided to a loopback channel and feeding back the test signals to the loopback channel via the buffer chip, wherein the loopback channel is connected to some of the connectors of the printed circuit board; and an information management circuit for outputting information of the memory device to the loopback channel via the buffer chip, wherein the information management circuit comprises:

a mode register for storing information on functions, features, or modes of the memory device;

a thermal sensor for detecting an internal temperature of the memory device; or a power sensor for sensing power of the memory device, wherein the information management circuit provides, as the information of the memory device, the information of the mode register, internal temperature information of the thermal sensor, or power information of the power sensor.

2. The memory module according to claim 1, wherein the loopback circuit receives and feeds back, as the test signals, loopback signals used for a validity test of the plurality of memory devices via the loopback channel.

3. The memory module according to claim 1, wherein the plurality of memory devices are grouped into memory devices of a first channel and memory devices of a second channel, and the buffer chip comprises a selector for receiving information of a memory device that belongs to the first channel or information of a memory device that belongs to the second channel and for outputting the received information to the loopback channel.

4. The memory module according to claim 1, wherein the buffer chip comprises a register for receiving and storing information provided from each of the plurality of memory devices.

5. The memory module according to claim 1, further comprising:

a power management integrated circuit for managing power input to the memory module, and outputting the power to the plurality of memory devices and the buffer chip.

6. The memory module according to claim 5, wherein the power management integrated circuit compares a critical power value with a power value coming into the memory module via the buffer chip, and transmits a result of the comparison to the loopback channel.

7. The memory module according to claim 1, further comprising:

a plurality of thermal sensors for measuring a temperature of the memory module.

8. The memory module according to claim 7, wherein the plurality of thermal sensors transmit the measured temperature of the memory module to the loopback channel via the buffer chip.

9. A method of operating a memory module, the method comprising:

in a test operation for a validity test of memory devices mounted to the memory module, performing a loopback operation, in which the memory devices feed back test signals to test equipment via a loopback channel, wherein the test signals are received from the test equipment;

in a data processing operation for the memory module, performing a write operation or a read operation of the memory devices; and outputting information of a memory device selected from among the memory devices, by using the loopback channel, wherein the selected memory device includes an information management circuit connected to the loopback channel and including: a mode register for storing information on functions, features, or modes of the selected memory device; a thermal sensor for detecting an internal temperature of the selected memory device; or a power sensor for sensing power of the selected memory device, wherein the information management circuit provides, as the information of the selected memory device:

the information on functions, features, or modes of the selected memory device, information on the internal temperature of the selected memory device, or information on power detected by the power sensor of the selected memory device.

10. The method according to claim 9, wherein the outputting of the information of the selected memory device comprises outputting, to the loopback channel, the information on functions, features, or modes of the selected memory device, while performing the write operation or the read operation of the memory devices.

11. The method according to claim 9, wherein the outputting of the information of the selected memory device comprises outputting, to the loopback channel, the information on the internal temperature of the selected memory device detected by the thermal sensor of the selected memory device, while performing the write operation or the read operation of the memory devices.

12. The method according to claim 9, wherein the outputting of the information of the selected memory device comprises outputting, to the loopback channel, the information on power detected by the power sensor of the selected memory device, while performing the write operation or the read operation of the memory devices.

* * * * *